United States Patent
Albertson et al.

(10) Patent No.: US 9,069,014 B2
(45) Date of Patent: Jun. 30, 2015

(54) WIRE PROBE ASSEMBLY AND FORMING PROCESS FOR DIE TESTING

(75) Inventors: Todd P. Albertson, Warren, OR (US); Michael T. Crocker, Portland, OR (US); David Shia, Portland, OR (US); Lothar R. Kress, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 199 days.

(21) Appl. No.: 13/539,391

(22) Filed: Jun. 30, 2012

(65) Prior Publication Data

US 2014/0002124 A1    Jan. 2, 2014

(51) Int. Cl.
*G01R 31/00* (2006.01)
*G01R 1/073* (2006.01)
*G01R 3/00* (2006.01)
*G01R 31/28* (2006.01)
*G01R 1/00* (2006.01)
*H01L 21/00* (2006.01)

(52) U.S. Cl.
CPC ....... *G01R 1/07378* (2013.01); *Y10T 29/49144* (2015.01); *Y10T 29/4913* (2015.01); *G01R 1/00* (2013.01); *H01L 21/00* (2013.01); *G01R 3/00* (2013.01); *G01R 31/2889* (2013.01); *G01R 1/07357* (2013.01)

(58) Field of Classification Search
CPC ...... G01R 1/00; G01R 2019/00; H01L 21/00; H01L 2021/00; H01L 2223/00; H01L 2924/00; H01L 2925/00; H01L 2221/00
USPC ........................................ 324/756.07
See application file for complete search history.

(56) References Cited

U.S. PATENT DOCUMENTS

| | | | |
|---|---|---|---|
| 6,768,327 B2* | 7/2004 | Felici et al. ............. | 324/755.06 |
| 2005/0085032 A1* | 4/2005 | Aghababazadeh et al. ... | 438/232 |
| 2007/0057685 A1* | 3/2007 | Garabedian et al. ........ | 324/756 |
| 2008/0121879 A1* | 5/2008 | Beaman et al. ............ | 257/48 |
| 2009/0133171 A1* | 5/2009 | Jin .......................... | 850/60 |
| 2009/0289253 A1* | 11/2009 | Pendse ..................... | 257/48 |
| 2011/0006796 A1* | 1/2011 | Kister et al. ............. | 324/756.01 |

* cited by examiner

*Primary Examiner* — Huy Q Phan
*Assistant Examiner* — Temilade S Rhodes-Vivour
(74) *Attorney, Agent, or Firm* — Blakely, Sokoloff, Taylor & Zafman LLP

(57) ABSTRACT

A wire probe assembly and forming process is described. In one example, a method includes inserting a plurality of wires through a probe former and a tip retainer to contact a probe head substrate, attaching the wires to a surface of the substrate, pulling the probe former laterally with respect to the substrate surface and the tip retainer to bend the wires into test probes with a resiliency to transverse movement, and removing the tip retainer to form a test probe head.

17 Claims, 8 Drawing Sheets

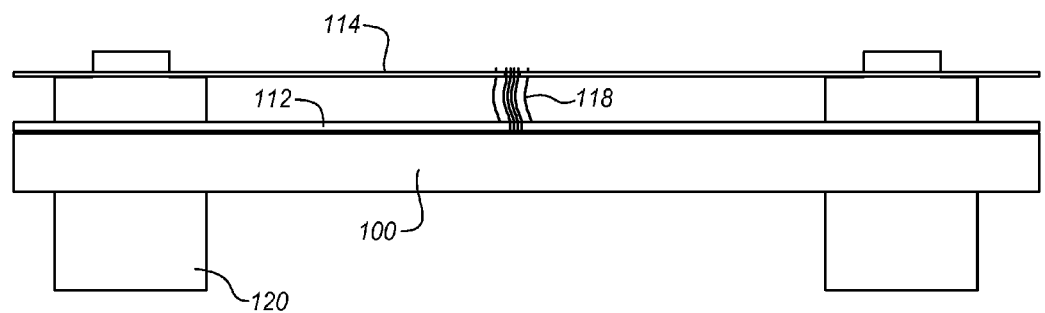
FIG. 5
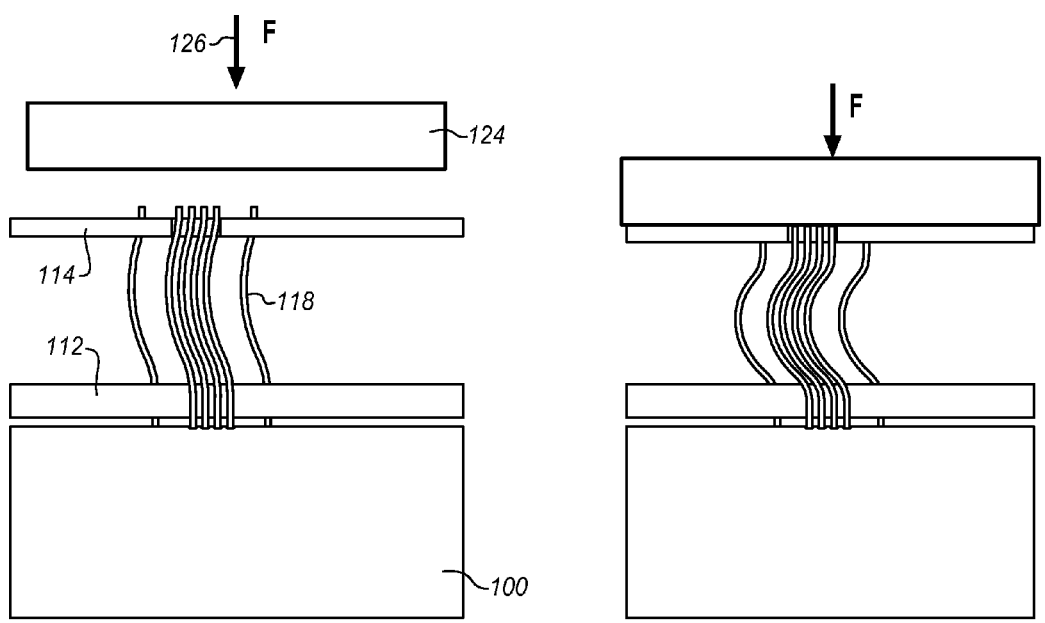
FIG. 6A  FIG. 6B

WIRE PROBE ASSEMBLY AND FORMING PROCESS FOR DIE TESTING

BACKGROUND

In the manufacture of microelectronic devices, such as processors, controllers, and memory, the desired structures are formed on a wafer. Individual dies are cut from the wafer and then sealed into a package. The package has an array of pins, pads, or lands that make contact with the rest of the device, typically through a printed circuit, board to allow the die to be operated while within the package. Before packaging, either as part of a wafer or an individual die, each die is tested to determine whether it has been manufactured correctly and operates as intended. In some cases, the dies are also sorted based on performance.

To perform the tests, some dies have lands or pads specifically designed into the die for test purposes. Pins or probes are applied to the lands or pads and signals are sent or received through the pins to test the die. For a more complex die, more pins are used. Similarly for denser circuitry on the die, the pins are closer together.

The test probes are attached to a substrate that holds each probe in the proper position with respect to each other probe so that when the tester is pressed against the pads on the die, each probe will contact its respective pad. The probes are resilient so that when the probes are pressed against the die the pressure of the contact is determined by the resiliency of the probe, not the pressure of from the test equipment. Each test probe has a limited number of die tests that it can perform, after which it must be replaced. The replacement cost of each test probe is therefore a factor in the cost of die manufacturing.

The substrate and the probes are typically separately manufactured using a MEMS (microelectromechanical systems) process, or a process similar to how transistors are made. Once the probes are made, they are assembled onto the space transforming substrate. The assembly is then processed to attach the probes to the substrate.

The individual probes are each manually inserted into the guide plate to contact the substrate. Each probe has a curve in its middle section so that when pressed against the die it will bend. The probes must all bend in the same direction so that they do not contact each other during use, possibly creating connections that destroy the die or the probe. Several thousand to tens of thousands of probes may be placed into a guide plate to build one sort tester for a microprocessor. This number is expected to increase as die complexity and density increases from today's probe counts. The process is performed manually in part due the shape of the probe. The central curve increases the complexity of the probes being inserted in an automated process.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 5 is a side cross-sectional diagram of the probe former assembly and jig of FIG. 3 with the probe former moved up according to an embodiment of the invention.

FIG. 6A is a partial side cross-sectional diagram of a further probe forming press according to an embodiment of the invention.

FIG. 6B is a partial side cross-sectional diagram pressing probes according to an embodiment of the invention.

DETAILED DESCRIPTION

By attaching straight wires to the substrate and then applying a curvature after the wires are attached, the process of attaching the wires may be automated. This allows more probes to be attached in denser arrays at lower cost. The wires may then be bent or curved after they are attached as described below. This approach drastically reduces the cost of test probe arrays and decreases assembly complexity providing a substantial reduction in the cost of microelectronic device fabrication.

Figure 1A:
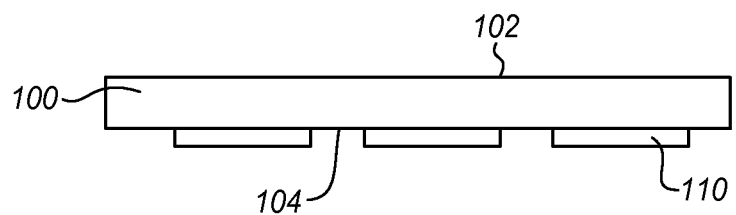
FIG. 1A is side cross-sectional diagram of a space transformer substrate with bottom surface connection arrays suitable for use with embodiments of the present invention.

FIG. 1A shows an example of a space transformer substrate used in a test probe head for a semiconductor die. The substrate 100 has a top surface 102 on one side and a contact area 110 on the opposite bottom side 104. In between the top surface and the contact area are conductive paths to transform the tight dense array of contact points on the top surface to a larger area on the bottom surface 104. The bottom surface is coupled to Automated Test Equipment (ATE) or another device to send and receive test signal with the DUT. The substrate is typically made using conventional semiconductor or printed circuit board techniques, however, the invention is not so limited. After the space transformer substrate is fabricated it is placed into a carrier (not shown). While the present invention is described as using a space transformer substrate, the principles described herein may be applied to any type of substrate that is used to contact to test probes in a test probe head.

Figure 1B:
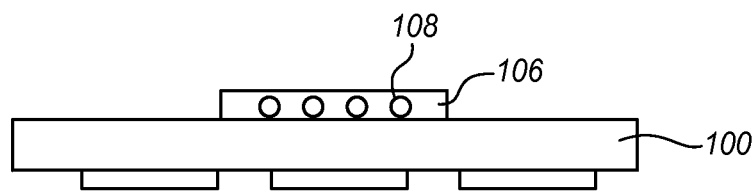
FIG. 1B is a partial side cross-sectional diagram of the space transformer substrate of FIG. 1A with solder balls attached to the top surface connection arrays suitable for use with embodiments of the present invention.
Figure 2:
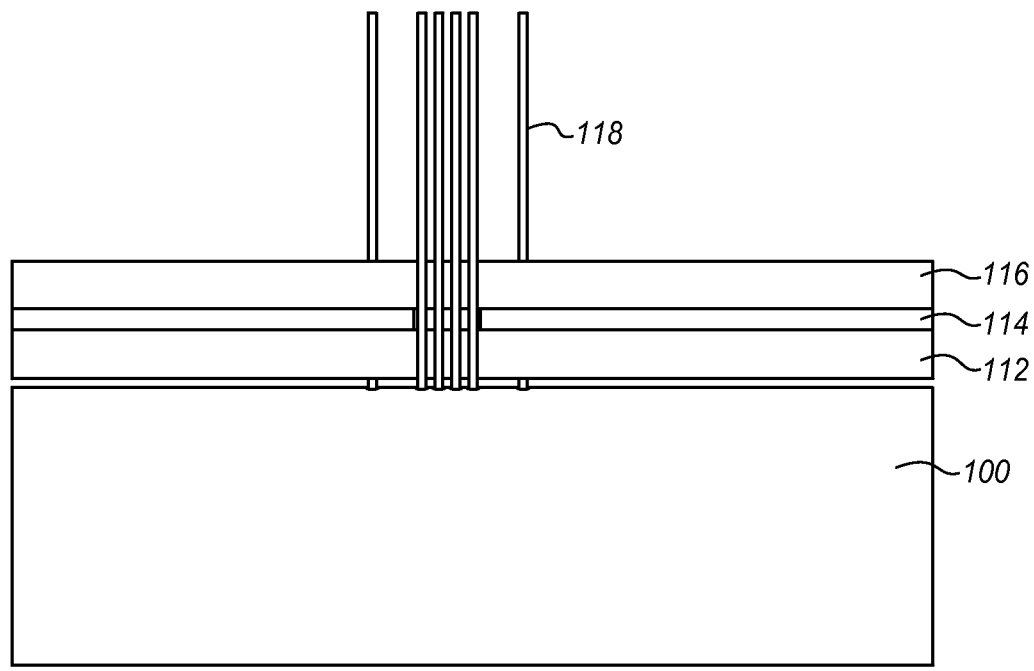
FIG. 2 is a partial side cross-sectional diagram of a probe forming assembly according to an embodiment of the invention.

In FIG. 1B, paste 106 has been applied to the top surface over the contact area to hold solder balls 108 in place over the connection points on the top surface. The test probe wires will be soldered in place to the solder balls using a reflow furnace after the wires are put in place. In FIG. 2, a probe holder 112 is placed over the substrate 100. A probe former 114 is placed over the probe holder and a probe tip retainer 116 is placed over the probe former.

Each of these structures is in the form of a thin plate with through holes. The holes are aligned with each other and are aligned with the solder paste pocket 108 shown in FIG. 1B. The plates may be placed using automated equipment through vision alignment and precision actuators. The plates can be held in place using vacuum or some other mechanical means and then after all three plates are in place, they may be clamped together. The plates may be held over the substrate using a carrier and a jig as described in more detail below.

The solder paste may be applied to the substrate before the plates are stacked over the substrate or it can be applied after placing the probe holder over the substrate. The probe holder can be used as a stencil for applying the paste and placing the solder balls.

Straight round wires 118 are then inserted through the holes in the probe tip retainer, probe former, and probe holder to make electrical contact with the substrate top surface and the solder balls. While only five wires are shown for simplicity, typically there will be thousands of wires inserted through the three plates to be attached to connection points on the substrate. This operation can be automated easily, since the wires are straight. As compared with conventional techniques, simple off-the-shelf wires may be used instead of specially formed square wires that are preformed or manufactured with a central bend. When considering that the probes wear out and new test probe heads must be made to replace them and that the number of probes per probe head is likely to increase as dies becomes more complex, the cost of each wire can make a significant total impact on testing cost.

At a later time in the forming process, the wires may be cut and the ends may be formed. As a result, at this stage, the wires will be longer than after the last stage. In addition, it is not necessary that the wires all be the same length. By cutting the wires after forming bends, any differences in the lengths of the wires, differences in the amount of bend, and differences in the top surface of the substrate can be compensated.

After all the wires are in place, the substrate and the three plates can be placed in a carrier with or without the jig into a reflow solder oven. As a result of the reflow oven, the solder paste creates solder balls to form an electrical joint between each wire and its respective connection location on the top surface of the space transformer substrate. The wires are also firmly attached to the substrate after the solder cools and hardens.

After reflow, the wires 118 are attached to the substrate 100 and the probe holder 112, probe former 114, and probe tip carrier 116 remain in place stacked over the substrate. After reflow, the probe holder 112 can be attached to the space transformer substrate 100. The solder balls may create a gap between the substrate and the probe holder. This can be filled in with epoxy underfill. The epoxy will fill in the spaces between and around the solder balls and further strengthen the structure. The epoxy is oven cured and then cooled to solidify.

Figure 3:
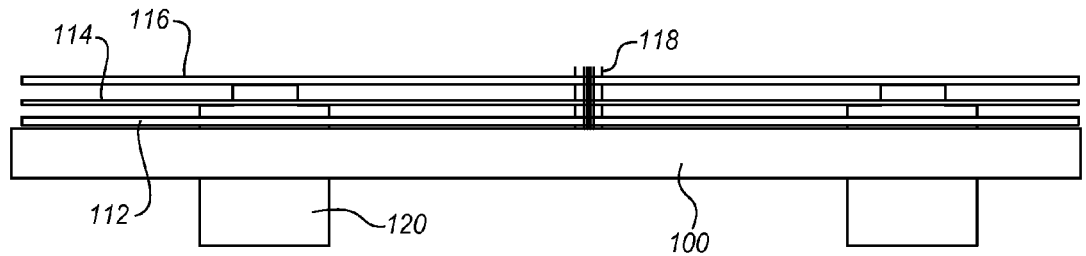
FIG. 3 is a cross-sectional diagram of the probe forming assembly of FIG. 2 attached to a jig according to an embodiment of the invention.

The carrier with the three plates of the assembly may then be placed into a forming fixture 120 as shown in FIG. 3. The forming fixture holds the probe carrier and attaches to each of the probe holder, the probe former and the probe tip carrier to independently move them to appropriate positions to form the wires into probe tips as shown in FIG. 3.

The probe tip retainer 116 is moved transversely up and away from the substrate and away from the bases of the wires toward the tips or ends of the wires. The tip retainer plate 116 is located near the ends of the wires, or near what will be the ends of the wires after they are cut, in order to hold the ends of the wires in place for the next process. Similarly the probe former plate 114 is also moved transversely up away from the substrate and toward the ends of the wires. The probe former is moved to a position that will be near the center of the bend that will be made in the wire by the probe former. The probe holder plate 112 is not moved in the illustrated example but serves to help to retain the bases of each pin in position on the substrate. This reduces the stress on the solder connection.

The probe tip retainer and the probe former may be moved using any of a variety of different actuators, such a hydraulic, piezo-electric, etc. Some force may be applied from the top of the jig using, springs, for example, to ensure that the plates are in good contact with the lift pins that raise the plates away from the substrate.

Figure 4A:
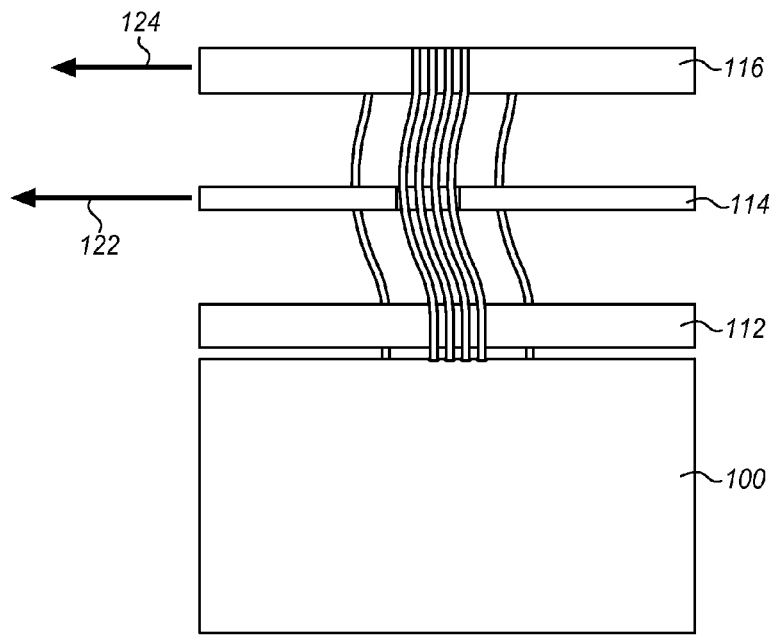
FIG. 4A is a partial cross sectional diagram of pulling wires to form probes according to another embodiment of the invention.

After the plates are in position, the probe former is moved laterally a defined distance as shown by arrow 122 in FIG. 4A. In one example, this distance is 150-250 µm. This motion as shown in FIG. 4A is parallel to and across the top surface of the substrate to impose a bend in the probe wires in the direction of the pull. The force applied to the wires by the probe former is about the same on each wire, so each wire is bent about the same amount. There will, however, be small variance due to variations in the material and construction of the wires. A pulling force of about 7 grams applied to a wire diameter of 50 µm has been found to be sufficient for a microprocessor probe test head and to obtain a lateral movement of 150-250 µm. The total force is more than 35 kg for a substrate to which 5000 probes are attached. The particular amount of force, lateral translation distance and distances between the plates may be adapted to suit different wire types, different wire sizes, and different probe shape requirements.

Stress and displacement modeling of the probe former plate shows that the force exerted by the many wires does not exceed the probe former plate's structural integrity during the forming process. Accordingly, the probe former plate may be made of any one of many different types of materials. Tungsten which has a yield point of 1200 MPa is one suitable material, however a variety of ceramics and metals may be used.

The probe former 114 may be constructed using simple round holes that are only a little larger than the wires that are inserted through it. This will work well to move the probe former 114 into the position shown in FIG. 4A. However, In order for the probe forming plate to move freely up to the tips of the bent probes after the forming process, the holes may be shaped.

Figure 4B:
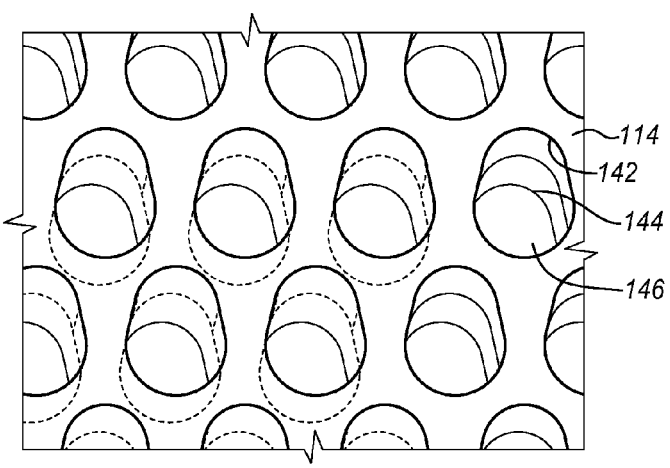
FIG. 4B is a partial perspective view of the probe former of FIG. 4A according to an embodiment of the invention.

FIG. 4B shows an alternative shape for the holes that reduces friction against the bent wires and allows the probe former to more easily release the probes after the first forming process. Each hole 144 is elongated so that it is larger at one end 146 than at the other 142 to facilitate the release process. The holes are in the form of avoids with the smaller end being on the opposite the direction of pulling. The smaller end captures the wire and draws it as the probe former is pulled. The larger end allows the bent wire to pass through the hole when the probe former is moved transversely up and down over the bent wires. Other hole shapes may also be used to suit different application and different wire shapes.

As the probe former 122 is pulled laterally across the substrate, the probe tip retainer will want to follow the probe former and also move laterally as indicated in FIG. 4 by arrow 124. This may be allowed to some extent as it may be used to create a better shape in the wires. A hard stop (not shown) in the jig will allow some movement as the probe former is pulled and then stop the probe tip retainer plate at a distance defined by the stop. In the example above with a 50 µm wire and a 150-250 µm translation of the probe former, a translation of about 100 µm allows a satisfactory bend in the wires. Depending on the particular wire shape desired the amount of movement may be varied, or alternatively, the probe tip retainer may be prevented from moving.

After the probe former is pulled, it is released. At this stage, the probe tips extend past the probe tip retainer further from the substrate and by differing distances. In other words, the length of each of the probes above the probe tip retainer may vary from probe to probe. This can in part be caused by the wires being different lengths from the beginning and in part from being affected differently by the process.

To even out the distances, the probe tips can be cut with a blade or laser. Note that the wire tips will be essentially at the same z position as set by the probe tip retainer as shown in FIGS. 5 and 6A. The cutting removes the variation in co-planarity due to warpage or uneven processing in the space transformer substrate. As a result, a wider selection of materials e.g. organic and ceramic can be used for the space transformer substrate. This may provide significant improvements in tooling cost structure and electrical performance. The probe tip retainer holds the tips of the probes in place during ablation and also protects the rest of the length of each probe from the laser during ablation of other tips.

After being cut, a variety of probe tip enhancements may be applied such as tip shaping, plating, etc. The particular choice of tip enhancements may be adapted to suit the particular form of the die being used. Alternatively some enhancement may be applied in a later operation.

The probe tip retainer 116 is lifted transversely away from the substrate and removed. The jig then pushes the probe former plate transversely up near where the probe tip retainer formerly was located. This is shown in FIG. 5. As shown, the prober holder 112 remains against the substrate 100 still relieving stress on the solder connections and locating the bottom of the probe relative to the substrate. The probe former 114 has been pushed to the position where the probe tip retainer was. The probe tip retainer has been removed. In lifting the probe former, the probe former must be allowed by the jig to move laterally. The removal process will be smoother if the probe former follows the contours of the probes. If friction between the wires and the plate is too high, then vibration may be applied to the plate of the substrate to help in moving it up. While the friction contribution of each wire may be small, with thousands of wires, the total friction may be high.

After the probe former is moved away from the bends so that the wires may bend without being inhibited by the probe former, the wires are further processed. As shown in FIG. 6A a pressure plate 125 is brought to bear on the tips of the wires. The pressure plate provides a transverse movement as shown by arrow 126. In FIG. 6B, the pressure plate has moved transversely down on the tips toward the substrate and the wires are bent 119 more than in FIG. 6A. The further bending of the wires increases the amount that the wires can bend when pressed against a die. This enhances their resiliency which improves the electrical contact that each wire will make with its corresponding pad on the die. The spring shape 119 of the wires 118 is now completed so that the wires are completely formed as resilient test probes.

Figure 7A:
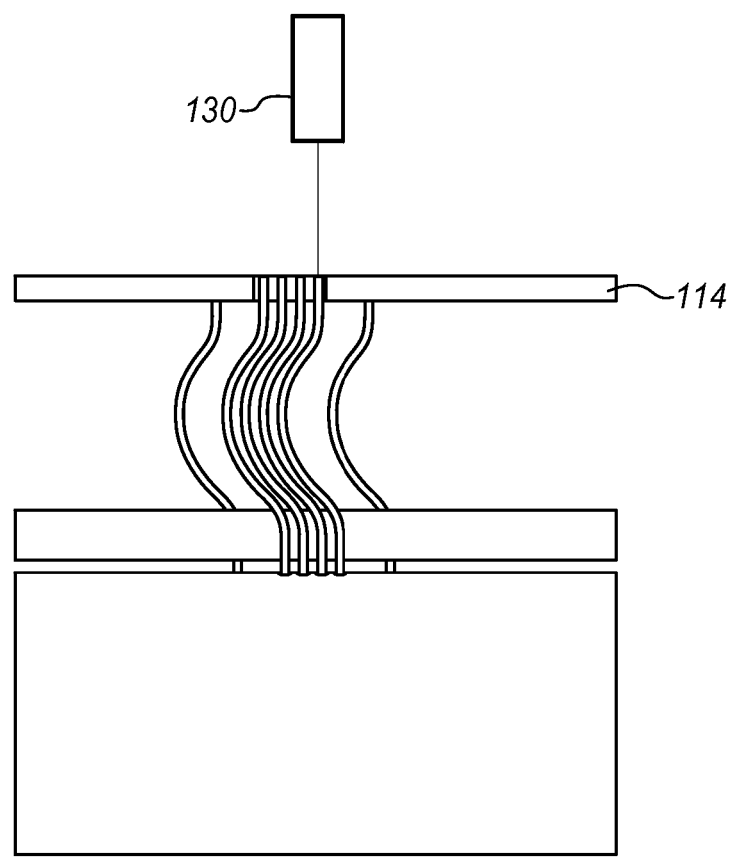
FIG. 7A is side cross-sectional diagram of laser ablation of formed probes according to an embodiment of the invention.
Figure 7B:
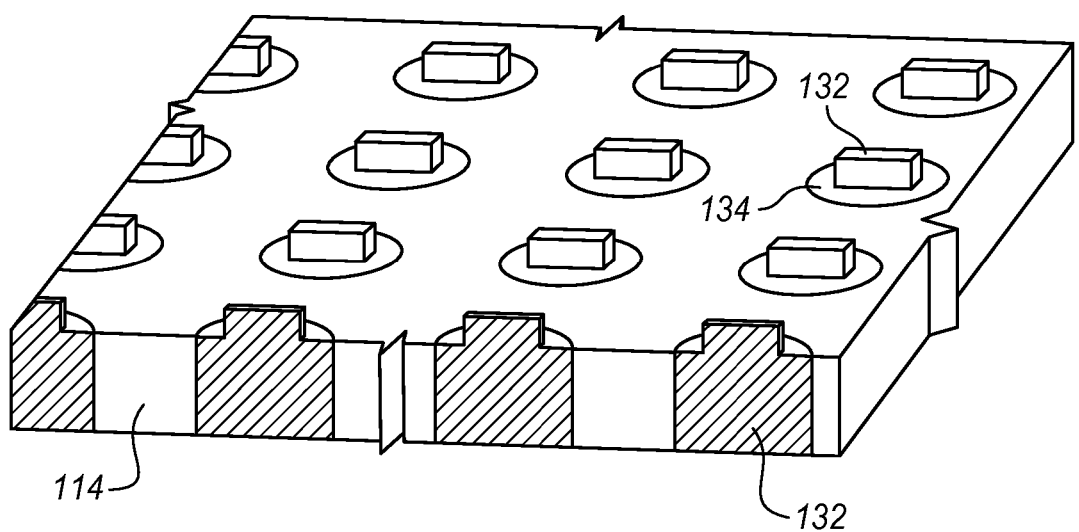
FIG. 7B is perspective and cross-sectional diagram of ablated and formed probes according to an embodiment of the invention.

In FIG. 7A, the tips of the test probes are exposed to laser oblation using a laser tool 130. This provides a small precise electrical contact surface that is well suited to mate with the dies. FIG. 7A shows the tips in more detail. As shown, after oblation each tip has a point 132 to contact a die pad and an oblated area 134 that leads to the rest of the wire. The thicker wire provides the necessary strength and durability, while the point provides a better tailored contact surface.

Figure 8:
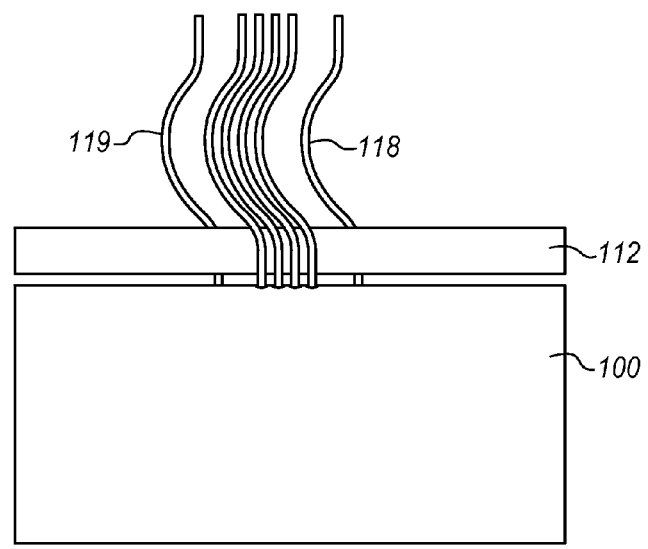
FIG. 8 is partial side cross-sectional diagram of a finished probe head according to an embodiment of the invention.

FIG. 8 shows the completed probes with the space transformer substrate 100, the probe holder 112 and the fully formed test probes 118. Each probe wire has a similar central bend 119 to provide a spring effect. This allows the probes to exert a spring force against the die when the probe head is pushed up against the die. It also allows each probe to independently compensate for variations in distance between the substrate and the respective die pad. Any non-uniformity in the surface of either surface can be compensated. In addition if the two parts are not precisely co-planar, that is if one side of the die is closer to the substrate than the other, then the probe tips are also able to compensate.

In designing the test probes, a balance may be found between strength, spring force and displacement under load. The probe tips must be able to bend enough to allow all probe tips to make a good contact with the die without requiring too much force and without bending so much as to touch another test probe. Using the arc shaped bend 119 shown in the figures, a good balance can be achieved.

With a wire having a 25 µm diameter that is pulled with 7.7 g, and pushed down with 8.5 g, it has been found that the arc will extend 180 µm laterally from the base of the wire and that the test probe will move 5 µm transversely with only 3.4 g of pressure. 5 µm is sufficient displacement for most probing applications and a 3.4 g load is within what most test probe equipment can produce. Similarly, with a wire having an 11 µm diameter that is pulled with 1.3 g, and pushed down with 0.66 g, it has been found that the arc will extend 145 µm laterally from the base of the wire and that the test probe will move 5 µm transversely with only 0.45 g of pressure.

As a result, formed probes using a variety of different wires are able to deform elastically under 35 µm over-travel, which is more than sufficient for many die test applications. The final shape does not have excess curvature; therefore, it is unlikely that it will cause interference with neighboring probes under probing conditions.

In the example of FIG. 8, the probe holder 112 remains in place against the substrate 100. The probe former 114 and the tip retainer 116 have been removed. Alternatively, after the wires are pulled, the probe former may be pushed down against the probe holder instead of being removed. The tip retainer may then be used in the processes of FIGS. 6A, 6B, and 7A instead of the probe former. The use of the plates and their movement may be modified in other ways in order to suit different materials, different test probe designs and other variations.

Figure 9B:
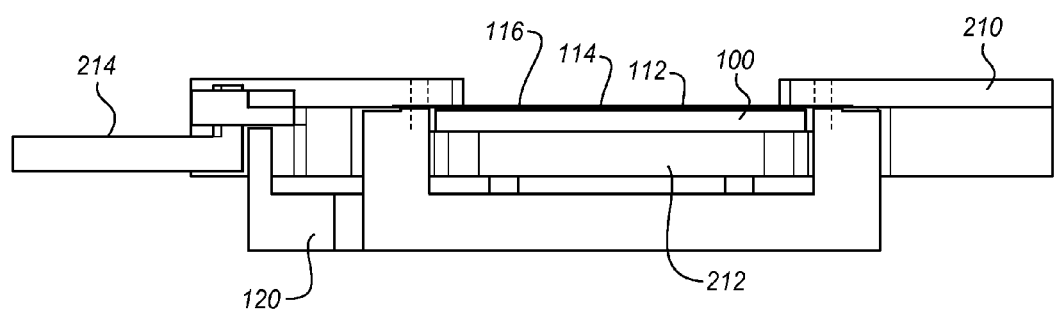
FIG. 9B is a side cross-sectional diagram of the probe forming jig of FIG. 9A according to an embodiment of the invention.
Figure 9A:
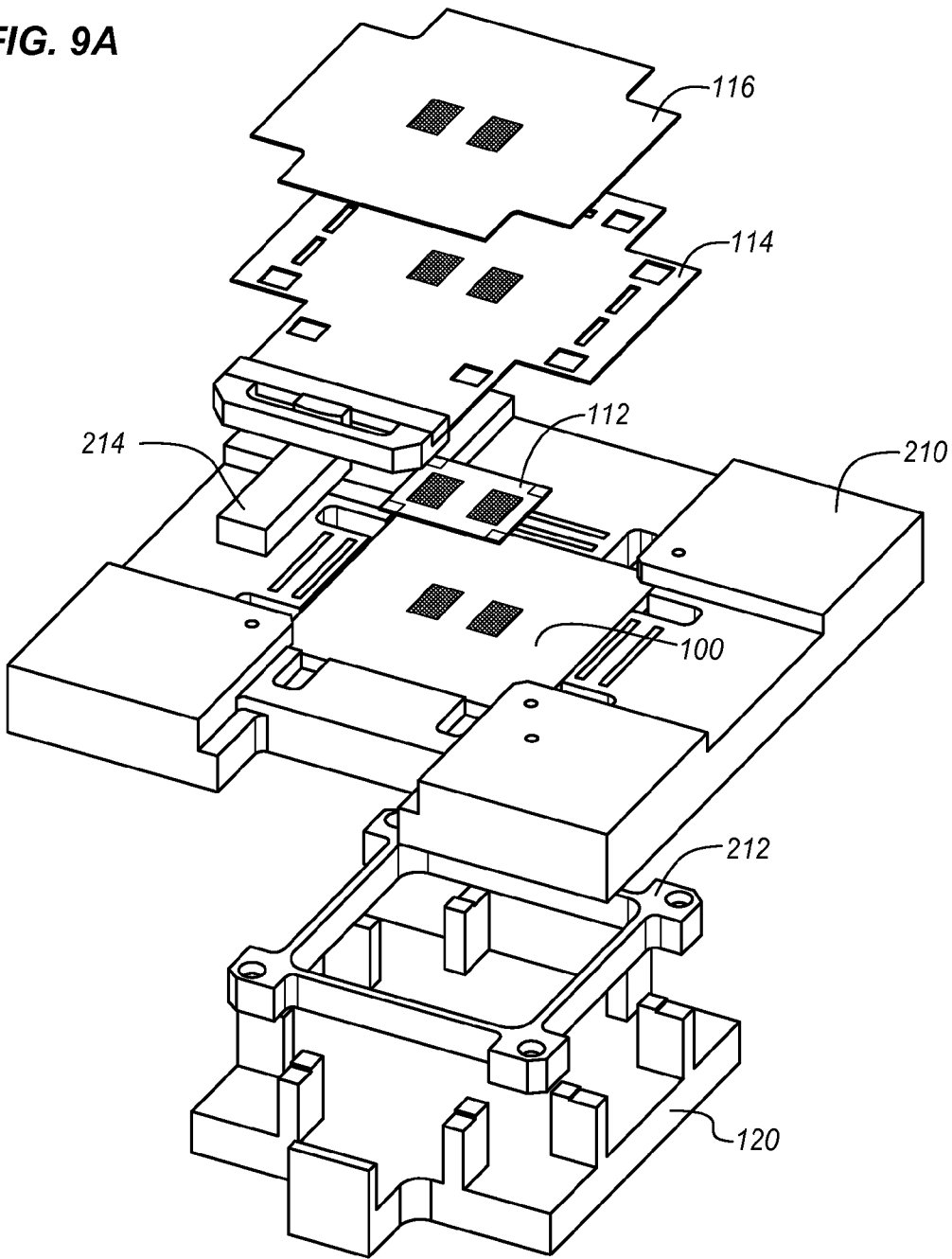
FIG. 9A is a perspective exploded diagram of probe forming jig and probe head according to an embodiment of the invention.

FIGS. 9A and 9B show a jig designed to implement the forming process described above. FIG. 9A is an exploded perspective view of an example probe forming jig. Many of the components of the jig are shown in the other figures. The jig has a carrier 210 to carry the space transformer substrate 100 and the wires that are attached to it and later formed. The carrier is clamped by a clamp 212 to a lift 120 that moves the plates up and holds the plates in place. As mentioned above and shown in FIG. 9A, there are three plates placed above the substrate, the probe holder 112, the probe former 113 and the probe tip retainer 116. The lift 120 manipulates the top two plates as described above. A puller 214 is also attached to the carrier to apply a lateral force to the probe former as indicate by arrow 122 of FIG. 4A.

FIG. 9B is a cross-sectional side view of the assembled probe forming jig. This view shows that the probe former and the probe tip retainer extend out laterally beyond the ends of the probe holder and are supported by the lift. This allows the lift to independently move these plates. The puller is attached to the probe former on one side.

Figure 10:
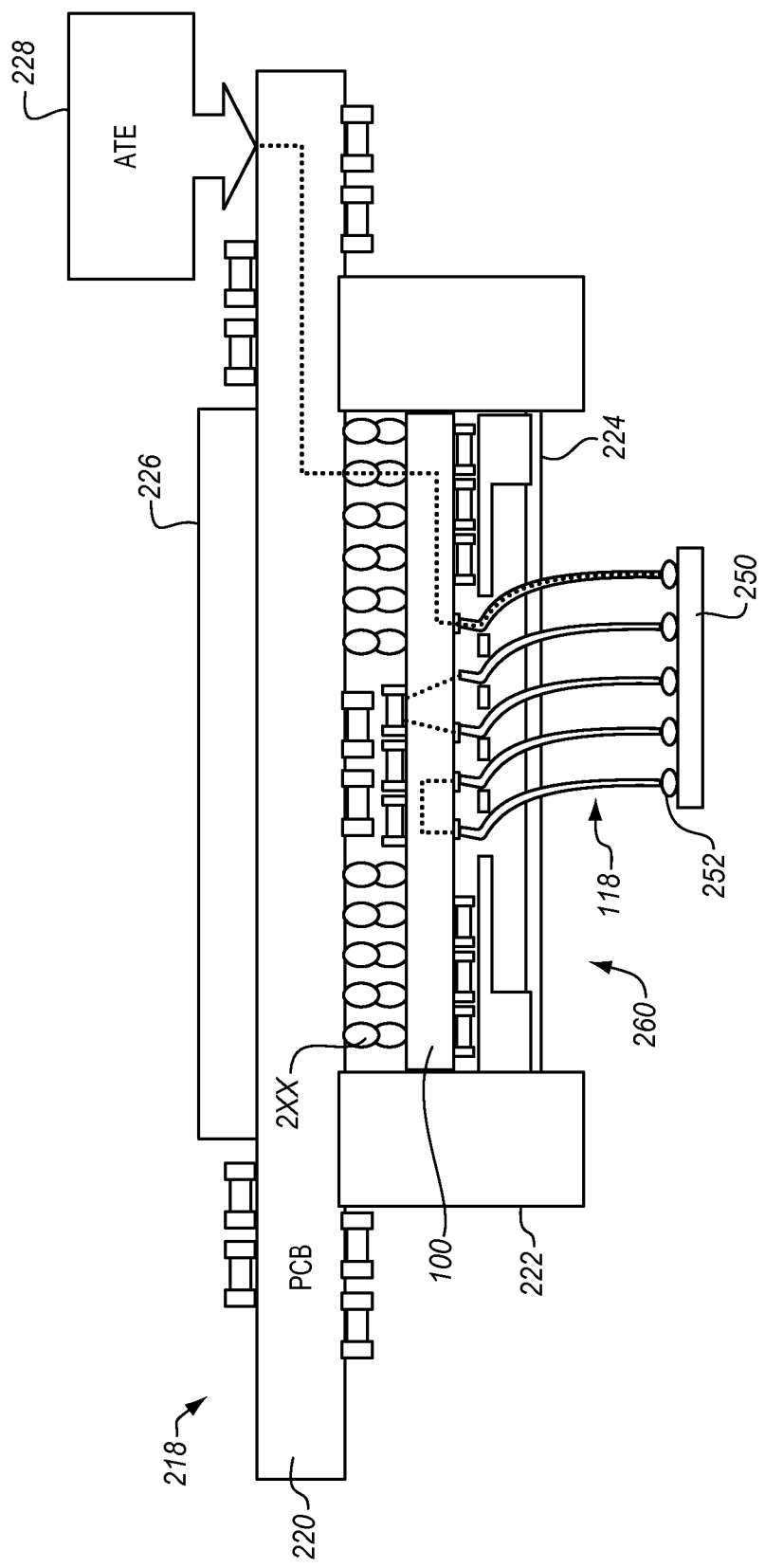
FIG. 10 is a side cross-sectional diagram of testing equipment using a probe head formed according to an embodiment of the invention.

FIG. 10 is a an example of testing equipment capable of using the formed test probes 118 and space transformer 100 in a testing probe head 260 to test and sort dies 250 of various types. The space transformer 100 has a contact pad array formed of the test probes as described above. The test probes are arranged in a pattern to match with test sites on the device under test 250, such as a die. The wire test probes 118 each have a lower end configured and arranged for mating with a corresponding test pad 252 on the DUT 250 to be tested. The test probes 118 have a pitch that matches the pitch of the test pads 252 on the DUT 50.

A probe test head 260 carries the substrate and the test probes on a testing PCB (Printed Circuit Board) 200, which is strengthened by stiffening hardware 226. A mounting ring 222 holds the testing probe head 260 supported by the mounting ring to the PCB. A bottom side holder 224, attached to the mounting ring, secures the substrate 100 within the test head. The space transformer substrate 100, which, as described above, may be a multi-layered organic (MLO) or multi-layered ceramic (MLC) interconnect substrate has a connection side 230 opposite the test probes. This connection side is formed using pads that are created when the substrate is originally manufactured. In the illustrated example, the connections are in a BGA (Ball Grid Array) for mating with corresponding contacts on the PCB 220. The PCB then connects to ATE (Automated Test Equipment) 228 which drives the test and measures the results through the test probes.

The example of FIG. 10 is a generalized diagram of test equipment to show a context for use of the test probes produced as described above. The test probes may be used in many other types of test equipment, depending on the nature of the DUT and the type of test to be performed. The test probes may also be used to test dies that are packaged or dies that are packaged together with other dies.

Figure 11:
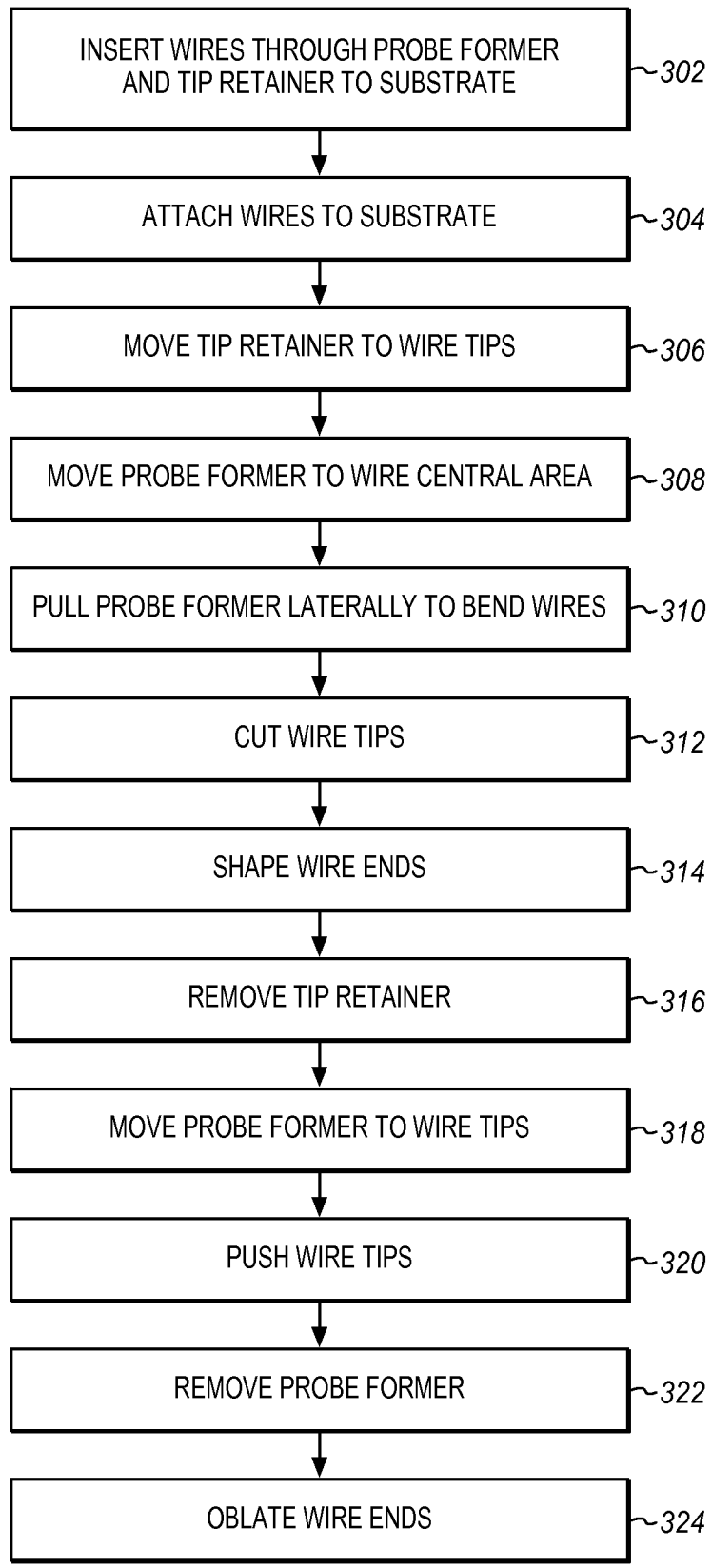
FIG. 11 is a process flow diagram of forming wire probes according to an embodiment of the invention.

FIG. 11 is a process flow diagram for the operations performed using the jig of FIG. 9A to form test probes from straight wires as described above. At 302, wires are inserted through a probe former and a tip retainer to contact a probe head substrate. The wires may also be inserted through a probe holder that is placed next to the space transformer substrate. At 304, the wires are attached to a surface of the substrate. The wires may be attached in any of a variety of different ways. Typically the wires are attached by inserting the wires through the probe holder to contact a solder ball on the probe substrate and then passing the substrate and the plurality of wires through a reflow furnace to solder the wires to the substrate Having assembled wires, which may be straight round wires to the substrate, the probe holder is attached to the substrate and the tip retainer is moved at 306 away from the substrate to a location near the tips of the wires to hold the tips in a position. Similarly at 308, the probe former is also moved away from the substrate after attaching the wires and before pulling so that the wires are bent at a distance from the substrate corresponding to the distance that the probe former is moved.

At 310 with the tip retainer and the probe former in place the probe former is pulled laterally with respect to the substrate surface and the tip retainer in order to bend the wires into test probes. The position of the substrate and the tip retainer are fixed and the probe former is pulled laterally Due to the bend in the form of an arc, the wires will have a resiliency to transverse movement. As mentioned above, the tip retainer may be allowed some lateral movement but not as much as the probe former.

At 312 the tips of the newly formed test probes are cut to a common length or to form a planar surface and at 314, the tips are shaped. After cutting the probe tips should be level so that variations in the substrate surface and the bend of each wire are compensated. With the tips formed, at 316, the tip retainer is removed. In one embodiment, the process is ended and the test probes of a test probe head are formed. The probe former can be removed or pushed back down against the substrate.

For even greater resiliency, the test probes can be further formed. At 318, the probe former is moved to the tips of the wires to hold the wire tips together. Then at 320 a transverse movement is applied to the test probe after they have been pulled. This further bends the test probes and adds further resiliency.

At 322, the probe former is removed after further bending the wires and, at 324, the ends of the wires are further formed by oblation, such as laser oblation. Additional processing may be performed on the test probes depending on the intended use for the probes.

It is to be appreciated that a lesser or more equipped prober former plate, forming jig probe head and testing apparatus than the examples described above may be preferred for certain implementations. Therefore, the configuration of the exemplary systems and components may vary from implementation to implementation depending upon numerous factors, such as price constraints, performance requirements, technological improvements, or other circumstances.

Embodiments may be adapted to be used with a variety of different probe wires, devices under test and space transformer substrates using various types of testing equipment for different implementations. References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, the specific location of elements as shown and described herein may be changed and are not limited to what is shown. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to method of fabricating a test probe head having a plurality of resilient test probes that comprises inserting a plurality of wires through a probe former and a tip retainer to contact a probe head substrate, attaching the wires to a surface of the substrate, pulling the probe former laterally with respect to the substrate surface and the tip retainer to bend the wires into test probes with a resiliency to transverse movement, and removing the tip retainer to form a test probe head.

Further examples may also include one or more additional steps such as removing the probe former after bending the wires, inserting the plurality of wires through a probe holder attached to the substrate, the probe holder having a hole to receive each wire and hold it into position on the substrate, moving the tip retainer away from the substrate to a location near the tips of the wires to hold the tips in a position, and moving the probe former away from the substrate after attaching the wires and before pulling so that the wires are bent at a distance from the substrate corresponding to the distance that the probe former is moved, applying a transverse movement to the probes after pulling to further bend the test probes and add further resiliency, cutting the ends of the probes after pulling so that the ends of the probe tips are level and so that variations in the substrate surface and the bend of each wire are compensated, and shaping the ends of the probes after cutting.

In any one or more of the above methods attaching the wires may comprise inserting the wires to contact a solder ball on the probe substrate and passing the substrate and the plurality of wires through a reflow furnace to solder the wires to the substrate. Pulling may comprise fixing the position of the substrate and the tip retainer and pulling the probe former laterally. The wires may be straight or round before inserting.

In another embodiment, an apparatus comprises a probe substrate carrier to hold a probe substrate in a fixed position, a probe holder above the carrier to hold a plurality of wires against a probe substrate, a probe former above the probe holder, a probe tip retainer above the probe former, a lift mechanism coupled to the probe tip retainer and the probe former to lift the probe tip retainer and the probe former from the probe substrate, and a puller coupled to the probe former to pull the probe holder laterally to bend the wires into test probes when attached to a probe substrate to provide the wires with a transverse resiliency.

Further embodiments may include a press above the carrier to press the bent wires transversely and increase the transverse resiliency of the bent wires. The probe holder may comprise a plurality of holes to hold the plurality of wires in a fixed position with respect to the probe substrate.

In another embodiment, an apparatus is a die test system for testing semiconductor dies using a probe head. The system comprises a testing probe head having a substrate and a plurality of test probes coupled to the substrate, the test probes being formed by first attaching a plurality of wires to the substrate and then pulling a probe former plate laterally across the substrate to bend the wires into test probes, a stiffened board to carry the testing probe head, a clamp to hold the testing probe head against the stiffened board, and automated test equipment to drive a test and measure the results through the test probes.

In further embodiments, the test probes are laser ablated after being formed using a probe tip retainer plate to hold the tips and protect the probes from ablation. In further embodiments, the testing probe head includes a probe holder plate attached to the substrate through which the test probes extend and are connected to the substrate.

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A method of fabricating a test probe head having a plurality of resilient test probes comprising:
   inserting a plurality of wires through a probe former and a tip retainer to contact a probe head substrate, the wires having a length aligned in a longitudinal direction, the probe former and tip retainer extending laterally with respect to the longitudinal direction;
   attaching the wires to a surface of the substrate;
   pulling the probe former laterally with respect to the longitudinal direction to bend the wires into test probes so that the test probes have a resiliency to transverse movement; and
   removing the tip retainer to form a test probe head.

2. The method of claim 1, further comprising removing the probe former after bending the wires.

3. The method of claim 1, further comprising inserting the plurality of wires through a probe holder attached to the substrate, the probe holder having a hole to receive each wire and hold it into position on the substrate.

4. The method of claim 1, wherein attaching the wires comprises inserting the wires to contact a solder ball on the probe substrate and passing the substrate and the plurality of wires through a reflow furnace to solder the wires to the substrate.

5. The method of claim 1, further comprising:
   moving the tip retainer away from the substrate to a location near the tips of the wires to hold the tips in a position;
   moving the probe former away from the substrate after attaching the wires and before pulling so that the wires are bent at a distance from the substrate corresponding to the distance that the probe former is moved.

6. The method of claim 1, wherein pulling comprises fixing the position of the substrate and the tip retainer and pulling the probe former laterally.

7. The method of claim 1, further comprising applying a transverse movement to the probes after pulling to further bend the test probes and add further resiliency.

8. The method of claim 1, further comprising cutting the ends of the probes after pulling so that the ends of the probe tips are level and so that variations in the substrate surface and the bend of each wire are compensated.

9. The method of claim 8, further comprising shaping the ends of the probes after cutting.

10. The method of claim 1, wherein the wires are straight before inserting.

11. The method of claim 1, wherein the wires are round before inserting.

12. An apparatus comprising:
a probe substrate carrier to hold a probe substrate in a fixed position;
a probe holder above the carrier to hold a plurality of wires against a probe substrate the wires having a length aligned in a longitudinal direction;
a probe former above the probe holder;
a probe tip retainer above the probe former;
a lift mechanism coupled to the probe tip retainer and the probe former to lift the probe tip retainer and the probe former away from the probe substrate; and
a puller coupled to the probe former to pull the probe holder laterally with respect to the longitudinal direction to bend the wires into test probes when attached to a probe substrate the bending causing the wires to have a transverse resiliency.

13. The apparatus of claim 12, further comprising a press above the carrier to press the bent wires transversely and increase the transverse resiliency of the bent wires.

14. The apparatus of claim 12, wherein the probe holder comprises a plurality of holes to hold the plurality of wires in a fixed position with respect to the probe substrate.

15. A die test system for testing semiconductor dies using a probe head, the system comprising:
a testing probe head having a substrate and a plurality of test probes coupled to the substrate, the test probes being formed by first attaching a plurality of wires to the substrate, the wires having a length aligned in a longitudinal direction, and then pulling a probe former plate laterally with respect to the longitudinal direction across the substrate to bend the wires into test probes;
a stiffened board to carry the testing probe head;
a clamp to hold the testing probe head against the stiffened board; and
automated test equipment to drive a test and measure the results through the test probes.

16. The system of claim 15, wherein the test probes are laser ablated after being formed using a probe tip retainer plate to hold the tips and protect the probes from ablation.

17. The system of claim 15, wherein the testing probe head includes a probe holder plate attached to the substrate through which the test probes extend and are connected to the substrate.

* * * * *